United States Patent [19]

Schadt, III

[11] Patent Number: 4,460,679

[45] Date of Patent: Jul. 17, 1984

[54] LOW COATING WEIGHT SILVER HALIDE ELEMENT

[75] Inventor: Frank L. Schadt, III, Wilmington, Del.

[73] Assignee: E. I. Du Pont de Nemours and Company, Wilmington, Del.

[21] Appl. No.: 514,174

[22] Filed: Jul. 15, 1983

[51] Int. Cl.³ .......................... G03C 5/24; G03C 1/00; G03C 1/76
[52] U.S. Cl. .................................. 430/409; 430/427; 430/430; 430/495; 430/496; 430/523; 430/539; 430/966
[58] Field of Search ............... 430/264, 302, 306, 309, 430/495, 496, 523, 539, 409, 427, 430, 966

[56] References Cited

U.S. PATENT DOCUMENTS

| | | | |
|---|---|---|---|
| 3,989,522 | 11/1976 | Poot et al. | 430/264 |
| 4,029,509 | 6/1977 | Blake | 430/409 |
| 4,047,956 | 9/1977 | Blake | 430/427 |

Primary Examiner—Mary F. Downey

[57] ABSTRACT

High speed, high quality positive or negative photographic elements comprising, in order, (1) a support, (2) a nonphotosensitive layer on said support containing a chemically bleachable, high strength tinctorial colorant, and (3) at least one photosensitive silver halide emulsion layer, characterized by the interposing of a timing layer between layers (2) and (3), and the addition of a hardener to layer (2).

5 Claims, No Drawings

LOW COATING WEIGHT SILVER HALIDE ELEMENT

BACKGROUND OF THE INVENTION

1. Field of the Invention

This invention relates to an improved process for preparing either positive or negative high quality images using a photographic system which employs very low coating weight silver halide elements. More particularly, this invention relates to a process which will permit sensitometric control over low coating weight prior art elements.

2. Description of the Prior Art

Blake, U.S. Pat. Nos. 4,029,509 and 4,047,956 describe respectively, a positive-working and a negative-working process for preparing high speed, high quality images from low coating weight silver halide elements, the latter comprising in order, (1) a support, (2) a nonphotosensitive layer containing a high strength tinctorial, bleachable colorant such as colloidal silver, mercury, palladium, or copper, and (3) a very low coating weight silver halide image capture layer. In the positive process, the composite element is exposed imagewise to actinic radiation and the latent image is developed therein. Simultaneously with, or just after the image development, the element is treated with a compound capable of generating sulfide ion, e.g. thiourea. After this step, the element is bleached to remove the developed silver and that area of the colorant layer directly under said imaged areas. The area of the colorant layer under the nonimaged areas is left to form a high quality direct positive of the original. In the negative process, the element is exposed imagewise and developed. Subsequently, the element is rapidly bleached to remove the colorant layer in the nonimaged areas and then is fixed to yield a high quality negative. In both processes the silver halide layer acts as a "resist" to modulate bleaching of the underlayer, which gives the image density desired.

The disadvantage of these prior art processes is that the final image has a very high gradient and the bleaching latitude is low. Thus, the images are not useful in many areas where gradient must be lower (e.g. medical X-ray) and the low bleach latitude makes it difficult to control the process with image-to-image consistency. Obviously, the Blake et al. concept could be improved if it could be modified to control the image gradient and bleaching latitude of low silver coating weight photographic elements, while continuing to use a bleachable, high tinctorial auxiliary layer.

SUMMARY OF THE INVENTION

The present invention provides a photographic element comprising in order (1) a support; (2) a nonphotosensitive layer on said support containing a chemically bleachable, high strength tinctorial colorant; and, (3) at least one photosensitive silver halide emulsion layer, characterized by the interposition of a timing layer between layers (2) and (3) and the addition of a hardener to layer (2). The element described above can be used to produce a negative image, using the following steps:

1. Imagewise expose layer (3).
2. Develop the latent image in layer (3).
3. No sooner than step 2, chemically bleach colorant layer (2) imagewise in the unexposed areas with an oxidizing bleach to form an image in said colorant layer corresponding to the image formed in said silver halide emulsion layer, whereby the latter image is intensified by the colorant image.
4. Fix the image in the silver halide emulsion layer and the colorant layer.

Alternatively, the process may be alerted to produce a positive image using the following steps:

1. Imagewise expose layer (3).
2. Develop the latent image in layer (3).
3. Simultaneously with, or just after step 2, treat the element with a compound capable of generating sulfide ions under the condition of treatment.
4. Chemically bleach said colorant layer and the image in the silver halide emulsion layer leaving an image in said colorant layer which corresponds to the nonimaged areas of the silver halide emulsion layer and thus is a positive image of the original.
5. Fix the image in the silver halide emulsion layer and colorant layer.

DETAILED DESCRIPTION OF THE INVENTION

It is preferred to use colloidal silver as the colorant layer in this invention. The colloidal silver may be made in gelatin according to the teachings of Firestine et al, German Pat. No. 1,234,031. Additional hardener may be added to the gelatino-colloidal silver layer, or the layer may be treated by bathing with a hardener solution after coating. A number of hardeners may be used. It is preferred to use glyoxal solution (e.g. 3% glyoxal in water) and treat the colloidal silver layer by soaking the layer in this solution. A host of timing layers are well known in the prior art. A simple gelatin layer is preferred. The colloidal silver layer can also be treated prior to use with a compound capable of retarding the rate of bleaching. The sodium salt of 1-phenyl-5-mercaptotetrazole is preferred, as a 0.0007% solution in water. The colloidal silver layer can be treated by dipping it in this solution. Alternatively, the mercaptotetrazole may be added directly to the gelatino-colloidal silver prior to coating.

The support for the elements and process of this invention can be any of the widely known and conventionally used photographic support systems. These include transparent films, opaque and translucent films, plates, and webs of various types. It is preferred to use polyethylene terephthalate prepared and subbed according to the teachings of Alles, U.S. Pat. No. 2,779,684, Example IV. These polyester films are particularly suitable because of their dimensional stability. Supports made of other polymers, e.g., cellulose acetate, cellulose triacetate, cellulose mixed esters, etc., may also be used. Polymerized vinyl compounds, e.g., copolymerized vinyl acetate and vinyl chloride, polystyrene, and polymerized acrylates may also be used, as well as materials described in the patents referenced in the above-cited Alles patent.

Other suitable supports are the polyethylene terephthalate/isophthalates of British Pat. No. 766,290 and Canadian Pat. No. 562,672 and those obtainable by condensing terephthalic acid and dimethyl terephthalate with propylene glycol, diethylene glycol, tetramethylene glycol or cyclohexane 1,4-dimethanol (hexahydro-p-xylene alcohol). The films of Bauer et al, U.S. Pat. No. 3,052,543, may also be used. Still other supports include metal, paper, plastic-coated paper, etc. Gelatin backing layers containing antistatic agents, or applied as anticurling layers, may be also employed in elements of the invention.

A whole host of materials may be used to form the chemically bleachable colorant layer. These include the colloidal silvers described in Firestine et al, German Pat. No. 1,234,031. These elements are preferred. Other materials include other colloidal metal, bleachable dyes, vacuum deposited metals etc. as described in Blake, U.S. Pat. No. 4,047,956, which is incorporated herein by reference. Various common hardeners may be added to the colorant layer to retard and control the rate of chemical bleaching and thus enhance the final, desired image. These include divinyl sulfones, triazines, formaldehyde, chrome alum, dimethylolurea, and glyoxal (preferred) among others. The hardeners may be added to the colorant layer prior to application onto the support or, alternatively, a solution containing the hardener may be used to bathe or treat the colorant layer after it is applied to the support and prior to the application of subsequent layers.

The timing layer is coated over the colorant layer. Preferably, a simple gelatin layer can be used to retard further the bleaching action and thus control the sensitometric curve shape of the final image. Other conventional, well-known elements can also be used to replace some gelatin in the timing layer, however. These include poly(sodium styrene sulfonate) having a mol. weight of about 70,000 and a copolymer of the sodium salts of styrene sulfonic acid and maleic acid in a 3:1 molar ratio and having a molecular weight of about 5000. These materials can be coated between the colorant layer and the photosensitive image capture layer and will function as suitable timing layers.

A photosensitive silver halide emulsion layer is then coated over the timing layer. This layer may be coated at a low silver halide coating weight since its purpose is only image capture and most of the image density is provided by the colorant layer coated thereunder. Preferably, a conventional silver halide emulsion comprising photosensitive silver halide grains dispersed in a binder is used. There may be employed any of the conventional silver halides, including silver bromide, silver chloride, silver iodide, or mixtures of two or more of the halides. Conventional photographic binding agents such as gelatin may also be used. In place of or in addition to gelatin, other natural or synthetic water-permeable, organic, macromolecular colloid binding agents can be used. These include (1) polyvinyl alcohol and its derivatives, e.g., partially hydrolyzed polyvinyl acetates, polyvinyl ether, and acetals containing a large number of —$CH_2CHOH$-groups; (2) and hydrolyzed interpolymers of vinyl acetate and comonomers such as maleic anhydride, acrylic and methacrylic acid ethyl ester, and styrene, as further disclosed in U.S. Pat. Nos. 2,276,322, 2,276,323 and 2,347,811; (3) the poly-N-vinyl-lactams of Bolton, U.S. Pat. No. 2,495,918; (4) the hydrophilic copolymers of N-acrylamido alkyl betaines described in Shacklett, U.S. Pat. No. 2,833,650; and (5) hydrophilic cellulose ethers and esters.

The silver halide emulsion may be chemically or spectrally sensitized using any of the known conventional sensitizers and sensitization techniques. Examples include sulfur sensitizers containing labile sulfur, e.g., allyl isothiocyanate, allyl diethyl thiourea, phenyl isothiocyanate and sodium thiosulfate; the polyoxyalkylene ethers in Blake et al, U.S. Pat. No. 2,423,549; nonoptical sensitizers such as amines as taught by Staud et al, U.S. Pat. No. 1,925,508 and Chambers et al, U.S. Pat. No. 3,026,203; and metal salts as taught by Baldsiefen, U.S. Pat. No. 2,540,086.

The emulsions can also contain such known antifoggants as 5-nitrobenzimidazole, benzotriazole, tetraazaindenes, etc., as well as the usual hardeners, e.g., chrome alum, formaldehyde, dimethylol urea, mucochloric cid, etc. Other emulsion adjuvants that may be added include matting agents, plasticizers, toners, optical brightening agents, surfactants, image color modifiers, etc. The photographic elements may also contain antihalation and antistatic layers in association with the layer or layers of this invention. In addition, protective abrasion layers may be applied over the photosensitive layer; in fact, it is so preferred.

Particularly preferred elements of the invention employ colloidal silver in the colorant layer, and employ a photographic silver halide emulsion layer in which the average silver halide grain size diameter ranges from 0.3 to 2.5 microns. The resulting photographic element should have a silver efficiency of at least 120–150, and preferably at least 300. Silver efficiency being defined in Blake, U.S. Pat. No. 4,047,956, at column 4, line 53-column 5, line 23.

In another embodiment of the invention the colorant and the photosensitive silver halide are contained within a single layer. By mixing the two and coating them as a single layer on a support, manufacturing costs can be lowered. In this embodiment it is preferred that (1) the colorant be present in an amount sufficient to increase the silver efficiency by at least 10%, compared to an element in which colorant is not present, and (2) the layer containing the photosensitive silver halide and the colorant have an optical density to visible light (i.e., above 500 nm) of at least 0.5 before exposure and processing, with an optical density of at least 1.0 being particularly preferred.

The photographic elements of this invention may be exposed in the same ways as for conventional silver halide products by exposing the layer containing the photosensitive silver halide emulsion to actinic radiation, as when used in a camera and exposed through a lens system to visible light. Contact exposure to light, e.g., UV or visible light, through a suitable transparency may also be used. If the photographic element is an X-ray film it can be exposed to X-radiation, either directly or by using intensifying screens, in the conventional manner, then processed in a conventional developer to develop the latent image in the silver halide emulsion layer, followed by imagewise bleaching of the colorant layer. The duration of development is dependent on the type of developer used, temperature of development, photographic speed of the emulsion, etc. After the image has been developed, the film preferably is given a rinse in water or stop bath to remove excess developer from the film. The remaining silver halide is removed by fixing (e.g., with sodium thiosulfate) and the film washed in water. Then, the film is immersed in a chemical bleach bath designed to oxidatively bleach the colorant layer.

Many such bleach baths are available dependent only upon the particular material used within the colorant layer. For colloidal silver layers, for example, aqueous potassium ferricyanide or cupric nitrate solutions containing halide ions are particularly efficacious. These bleach solutions may also contain other adjuvants to adjust the pH, for example, or to aid in layer pentration by the oxidant. The bleaching may be carried out by any method of treating the element over its entire surface with bleach, including spraying, wiping, immersing, etc. This oxidative bleaching step will selectively reduce the optical density of the colorant layer (e.g., by 95% or more, as measured after fixing) in the unexposed areas without removing the colorant corresponding to the exposed areas of the silver halide layer (negative mode). After the bleaching step, the remaining silver halide is removed by fixing in a conventional fixing bath (e.g., sodium thiosulfate solution) and water washed. The final high quality, high contrast image preferably is water washed to remove residual amounts of fixer. Alternatively, one may use a combined bleach fix bath ("Blix").

This process can produce either a negative or a positive image depending on whether or not the colorant layer has been treated with a compound capable of generating sulfide ions under the condition of treatment. The use of higher levels of hardener in the colorant layer and the interposition of a timing layer between the photosensitive image capture layer and the colorant layer permits a better sensitometric curve shape and lower gradient in the final, high density image. Thus, it is possible to use this process in a wide variety of applications not possible with the prior art Blake elements.

This application will now be illustrated by the following examples of which Example 1 is considered the best mode:

EXAMPLE 1

A sample of blue colloidal silver dispersed in gelatin was prepared according to the teachings of Firestine et al, German Pat. No. 1,234,031. This material was coated on a 0.004 inch (0.0102 cm) thick polyethylene terephthalate film base made according to Alles, U.S. Pat. No. 2,779,684, Example IV, and subbed on both sides with a layer of vinylidene chloride/alkyl acrylate/itaconic acid copolymer mixed with an alkyl acrylate polymer as described in Rawlins, U.S. Pat. No. 3,443,960, and then coated on both sides with a thin anchoring substratum of gelatin (about 0.5 mg/dm$^2$). After drying, the film support containing the layer of colloidal silver had an optical density of about 2.35 to yellow light and had a coating weight of about 6.6 mg/dm$^2$ calculated as silver in about 13 mg/dm$^2$ gelatin to provide a silver covering power of about 356.

Six samples of colloidal silver were prepared. Sample A (the control) was then overcoated with high speed medical X-ray emulsion comprising about 98 mole percent silver bromide and about 2 mole percent silver iodide. The emulsion was a standard gelatino-silver halide emulsion, sensitized to its optimum sensitivity with gold and sulfur and containing the usual adjuvants (e.g. antifoggants, hardeners, wetting agents, coating aids, and the like). The emulsion for the six samples was coated at various silver halide coating weights which averaged about 48 mg silver halide/dm$^2$ and overcoated with a thin layer of hardened gelatin to provide a suitable abrasion layer thereon.

The other samples of colloidal silver were treated as follows:

Sample B: Added a 13 mg gel/dm$^2$ timing layer between the colloidal silver layer and the emulsion layer.

Sample C: Dipped the colloidal silver layer for 1 minute in an aqueous solution (3%) of glyoxal hardener, followed by air drying, prior to the application of the emulsion layer.

Sample D (of this invention): Dipped the colloidal silver layer in the hardener solution (per C, above), applied a timing layer (per B, above) prior to the application of the emulsion layer.

Sample E: Added a 26 mg. gel/dm$^2$ timing layer between the colloidal silver layer and the emulsion layer.

Sample F: Dipped the colloidal silver layer for 1 minute in an aqueus soln. (0.00077%) of sodium-1-phenyl-5-mercaptotetrazole (NaPMT) and glyoxal (3%), followed by air drying, and applied to a timing layer per B, above.

Sample strips from each of the above coatings were then exposed through a $\sqrt{2}$ step wedge for $10^{-2}$ seconds on a Mark 7 Sensitometer produced by E. G. and G. Co. (GE Type FT-118 Xenon Flash Tube) containing a 1.0 neutral density filter and a No. 207763, $10^{-2}$ compensating attenuator grid. The samples were then developed for 90 seconds in a standard phenidone/hydroquinone developer solution, placed in an acetic acid stop bath for 15 seconds, fixed in a thiosulfate bath for 90 seconds, washed in tap water for about 30 seconds, air dried, and then were bleached imagewise for various times (65–130 sec.) in a bath prepared by diluting the following concentrate bleach bath 1:3 with distilled water:

| | |
|---|---|
| Water | 800 ml. |
| Glacial Acetic Acid | 10 ml. |
| Potassium Alum | 25 g. |
| Sodium Borate | 20 g. |
| Potassium Bromide | 20 g. |
| Potassium Ferricyanide | 60 g. |
| Water up to | 1 liter |

The oxidizer bath bleached the colloidal silver layer imagewise, corresponding to the developed silver image in the exposed and developed photosensitive silver halide emulsion layer. Specifically, the areas of colloidal silver under the unexposed areas of the silver halide emulsion layer were bleached away, leaving the areas of colloidal silver under the developed silver image, resulting in a high density, negative image of the original. The film strips were then fixed in a thiosulfate solution for about 90 seconds, followed by a water rinse. The dried samples had the following sensitometry:

| Sample | Mid-Gradient | Dmax | Silver Halide Coat. Wt (mg.AgX/dm$^2$) |
|---|---|---|---|
| A-control | 6.3 ± 0.3 | 3.5 ± 0.2 | 68 |
| B-timing layer alone | 4.9 ± 0.5 | 3.1 ± 0.2 | 51 |
| C-hardener alone | 4.5 ± 0.7 | 2.7 ± 0.1 | 38 |
| D-both B and C treatments | 3.0 ± 0.1 | 2.6 ± 0.2 | 42 |
| E-thicker timing layer | 4.1 ± 0.0 | 2.9 ± 0.0 | 47 |
| F-NaPMT treatment plus B & C | 3.5 ± 0.10 | 2.8 ± 0.10 | 40 |

It can be seen that a suitable curve shape with a lower gradient is achieved following the teachings of this invention. The quality of the image was excellent and the gradient showed that this film could be used in a variety of functions (e.g., medical X-ray, etc.)

EXAMPLE 2

Six (6) samples of the blue colloidal silver film were prepared as described in Example 1. Sample A (control) was coated with the same emulsion as described in Example 1 and overcoated with a hardened gelatin abrasion layer as further described therein. In sample B, a gelatin timing layer (13 mg/dm$^2$) was interposed between the emulsion layer and the colloidal silver layer. In Sample C, the colloidal silver layer was dipped in the glyoxal solution of Example 1 prior to applying the emulsion layer. Sample D (of this invention) contained both the timing layer of Sample B and the hardening treatment of Sample C. In Sample E a thicker timing layer (26 mg gel/dm$^2$) was interposed between the emulsion layer and the colloidal silver layer. In sample G the colloidal silver layer was dipped in solution containing 8.3×10$^{-4}$ weight percent of the sodium salt of 1-phenyl-5-mercaptotetrazole (NaPMT), a bleach retardant, prior to coating with a 13 mg gel/dm$^2$ timing layer. The coating weights of the emulsion layer were as given in Example 1 for A–E and 42 mg AgX/dm$^2$ for Sample G.

Sample strips from these coatings were then exposed as described in Example 1. The samples were then developed for 5 seconds in a standard phenidone/hydroquinone developer as in Example 1 and then for 60 seconds in the same developer additionally containing 0.8 g/liter of thiourea (a compound capable of producing sulfide ions) and 0.01 g/l. of NaPMT added as a solution of 1 g in 100 ml. alcohol. The developed strips were then water washed for 15 seconds and oxidized for about 3½ min. in the ⅜ diluted oxidizer bath of Example 1. Then the samples were water washed, fixed for 60 seconds, water washed, and dried as described in Example 1. In each case, a direct positive image of the original step wedge was obtained since the oxidizer also bleached away the exposed silver halide image and the corresponding colloidal silver layer directly thereunder. Since the developer also contained thiourea, the colloidal silver corresponding to the nonimaged areas of the silver halide layer were protected by the generated sulfide ions which served to insolubilize the silver in these areas and thus prevent oxidation by the bleach. Although a direct positive image was produced in each case, the sensitometry varied as can be seen below.

| Sample | Dmax | Dmin |
|---|---|---|
| A - control | 0.57 | 0.12 |
| B - timing layer alone | 0.67 | 0.23 |
| C - hardener alone | very low density | |
| D - timing layer + hardener | 1.01 | 0.53 |
| E - thicker timing layer | 1.28 | 0.17 |
| G - NaPMT + B | 1.32 | 0.57 |

Samples D, E and G produced better direct positive images per the teachings of this invention.

A host of hardening agents common to the gelatino-silver halide field can be used within the ambit of this invention. The oxidization (bleach) materials described in Blake, U.S. Pat. Nos. 4,047,956 and 4,029,509, can also be used in this invention as well as the colorant layers described therein, and are incorporated by reference. Many other timing layers, including mixtures of gelatin and other polymers, can also be used within the ambit of this invention. The use of the hardener treatment of the colorant layer, and the interposition of a timing layer between the image capture layer and the colorant layer, permits wider use of the process described by the Blake patents supra. The resulting images have wider latitudes and softer characteristics of the H and D curve with more pronounced toe than those produced by practicing the Blake patents. This then presents a surprising and useful modification of the prior art.

I claim:
1. A photographic element comprising, in, order, (1) a support, (2) a nonphotosensitive layer on said support containing a chemically bleachable, high strength tinctorial colorant, and (3) at least one photosensitive silver halide emulsion layer, characterized by the interposition of a timing layer between layers (2) and (3) and the addition of a hardener to layer (2).

2. The photographic element of claim 1 wherein the timing layer is composed of gelatin.

3. The photographic element of claim 2 wherein some of the gelatin in the timing layer is replaced by a member of the group consisting of (a) poly(sodium styrene sulfonate) having a mol. weight of about 70,000, and (b) a copolymer of the sodium salts of styrene sulfonic acid and maleic acid in a 3:1 molar ratio and having a molecular weight of about 5000.

4. A process of producing a negative image from the photographic element of claim 1 which comprises the steps of:
 1. Imagewise exposing layer (3),
 2. Developing the latent image in layer (3),
 3. No sooner than step 2, chemically bleaching colorant layer (2) imagewise in the unexposed areas with an oxidizing bleach, to form an image in said colorant layer corresponding to the image formed in said silver halide emulsion layer, whereby the latter image is intensified by the colorant image, and
 4. Fixing the image in the silver halide emulsion layer and the colorant layer.

5. The process of forming a positive image from the photographic element of claim 1 which comprises the steps of
 1. Imagewise exposing layer (3).
 2. Developing a latent image in layer (3),
 3. Simultaneously with, or just after step 2, treating the element with a compound capable of generating sulfide ions under the condition of treatment,
 4. Applying a chemical bleach to said colorant layer and the image in the silver halide emulsion layer, leaving an image in said colorant layer which corresponds to the nonimaged areas of the silver halide emulsion layer and thus is a positive image of the original.
 5. Fixing the image in the silver halide emulsion layer and colorant layer.

* * * * *